US009178132B2

(12) United States Patent
Lin et al.

(10) Patent No.: US 9,178,132 B2
(45) Date of Patent: Nov. 3, 2015

(54) THREE-DIMENSIONAL INTEGRATED CIRCUIT AND METHOD OF TRANSMITTING DATA WITHIN A THREE-DIMENSIONAL INTEGRATED CIRCUIT

(71) Applicant: National Tsing Hua University, Hsinchu (TW)

(72) Inventors: Chrong Jung Lin, Hsinchu (TW); Ya-Chin King, Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 93 days.

(21) Appl. No.: 14/196,547

(22) Filed: Mar. 4, 2014

(65) Prior Publication Data

US 2015/0155476 A1    Jun. 4, 2015

(30) Foreign Application Priority Data

Dec. 4, 2013   (TW) .............................. 102144489 A

(51) Int. Cl.
```
G01R 33/09     (2006.01)
H01L 43/02     (2006.01)
G01R 33/02     (2006.01)
H01L 25/16     (2006.01)
```
(52) U.S. Cl.
CPC ............... *H01L 43/02* (2013.01); *G01R 33/02* (2013.01); *G01R 33/098* (2013.01); *H01L 25/16* (2013.01); *H01L 2924/0002* (2013.01)

(58) Field of Classification Search
CPC ....................................................... H01L 43/02
See application file for complete search history.

(56) References Cited

U.S. PATENT DOCUMENTS

| | | | | |
|---|---|---|---|---|
| 8,933,715 | B2* | 1/2015 | Leedy | G01R 31/2894 324/750.01 |
| 2006/0039189 | A1* | 2/2006 | Chen | G11C 11/16 365/158 |
| 2014/0061943 | A1* | 3/2014 | Kawa | H01L 21/76898 257/774 |
| 2015/0054090 | A1* | 2/2015 | Or-Bach | G11C 16/02 257/401 |
| 2015/0077173 | A1* | 3/2015 | Goodnow | H01L 25/0657 257/774 |
| 2015/0188540 | A1* | 7/2015 | Chang | H03K 19/0008 326/21 |

* cited by examiner

*Primary Examiner* — Jermele M Hollington
(74) *Attorney, Agent, or Firm* — Birch, Stewart, Kolasch & Birch, LLP

(57) ABSTRACT

A three-dimensional integrated circuit includes a plurality of perpendicular stacked chips. Each chip of the plurality of perpendicular stacked chips includes at least one transistor, a sensing coil, and a magnetic sensor, wherein the magnetic sensor is installed above the at least one transistor and the sensing coil and the sensing coil is installed between the magnetic sensor and the at least one transistor. The chip utilizes the sensing coil to generate a magnetic field including data, and a first chip of the plurality of perpendicular stacked chips adjacent to the chip utilizes a magnetic sensor of the first chip to receive the data generated by the sensing coil of the chip through the magnetic field generated by the sensing coil of the chip.

8 Claims, 5 Drawing Sheets

THREE-DIMENSIONAL INTEGRATED CIRCUIT AND METHOD OF TRANSMITTING DATA WITHIN A THREE-DIMENSIONAL INTEGRATED CIRCUIT

TECHNICAL FIELD

The present invention relates to an integrated circuit, more particular a three-dimensional integrated circuit and a method of transmitting data within the three-dimensional integrated circuit.

BACKGROUND

Currently, three-dimensional (3D) integrated circuits have been widespread interest from the IC designers, and the 3D integrated circuit can be used to develop a mix IC system with high-density, high flexibility and versatility. Refer to FIG. 1, FIG. 1 illustrates a diagram of a conventional 3D integrated circuit 100 with a vertical through silicon via (TSV). As shown in FIG. 1, TSV 101 and 102 offer a data transmission channel between the chips 103 and 104 in 3D ICs. However, the technology of the TSV suffers from high cost, low reliability, and ESD issues and cause the limitation of the maximum data rate of the 3D integrated circuit.

FIG. 2 illustrates a diagram of a conventional 3D integrated circuit 200 with capacitive sensing. As shown in FIG. 2, chips 203 and 204 in the 3D integrated circuit 200 have capacitive sensing units 2032 and 2034 respectively. Chips 203 and 204 transmit the information via the capacitive sensing units 2032 and 2034. However, capacitive sensing units 2032 and 2034 must be charged by the chips 203 and 204 before the data transmission, thus, the data transmission rate will lower due to the charge process. Thus, the conventional 3D integrated circuits are not a good solution for designers.

SUMMARY

In one embodiment, a three-dimensional integrated circuits and the method of transmitting data within the three-dimensional integrated circuits thereof are provided, the three-dimensional integrated circuit includes a plurality of perpendicular stacked chips, wherein each chip comprises at least one transistor, a sensing coil and a magnetic sensor, wherein the magnetic sensor is configured above the sensing coil and the transistor and the sensing coil is located between the transistor and the magnetic sensor, a plurality of perpendicular stacked chips, wherein each the chip comprises at least one transistor, a sensing coil and a magnetic sensor, wherein the magnetic sensor is configured above the sensing coil and the transistor and the sensing coil is located between the transistor and the magnetic sensor, wherein, the chip generates a magnetic field with data by utilizing the sensing coil, and a first chip of the plurality of perpendicular stacked chips adjacent to the chip receives the data generated by the sensing coil of the chip by the magnetic coil of the first chip.

Aforementioned, an embodiment in accordance with the present invention provides a three-dimensional integrated circuit and a method of transmitting data within the three-dimensional integrated circuit thereof. The present invention generates a magnetic field with data via a sensing coil, and then receives the data via a magnetic sensor. Thus, the cost can be reduced, the reliability can be increased and without ESD. Furthermore, the data transmission can be achieved by the magnetic field without any charge, so the data transmission rate is faster than the conventional structure and methodology.

BRIEF DESCRIPTION OF THE DRAWINGS

Features and advantages of embodiments of the subject matter will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
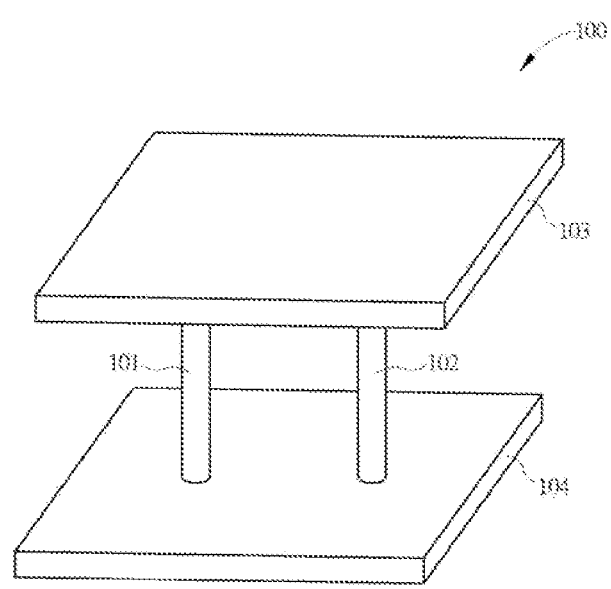
FIG. 1 illustrates a diagram of a conventional 3D integrated circuit with a vertical through silicon via (TSV).
Figure 2:
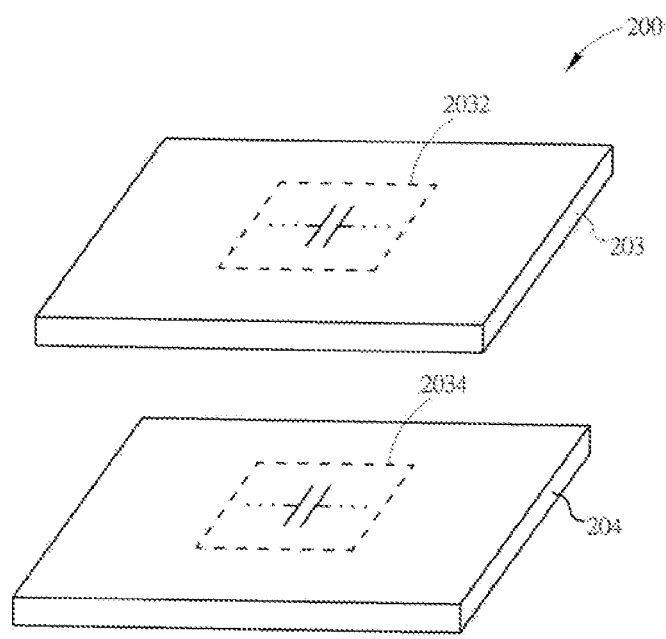
FIG. 2 illustrates a diagram of a conventional 3D integrated circuit with capacitive sensing.
Figure 3:
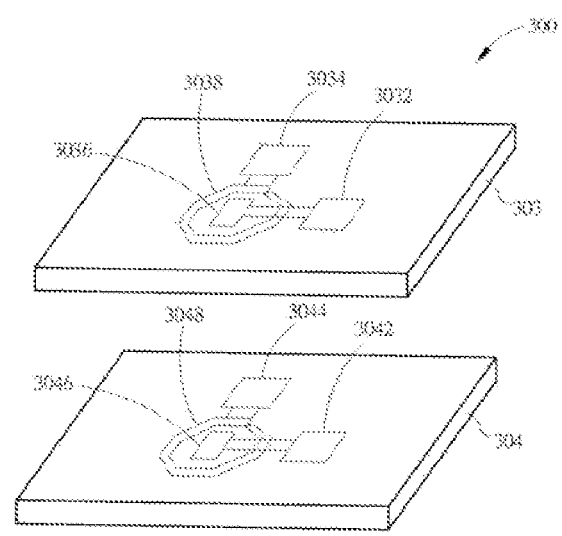
FIG. 3 illustrates a three-dimensional integrated circuit in accordance with one embodiment of the present invention.
Figure 4:
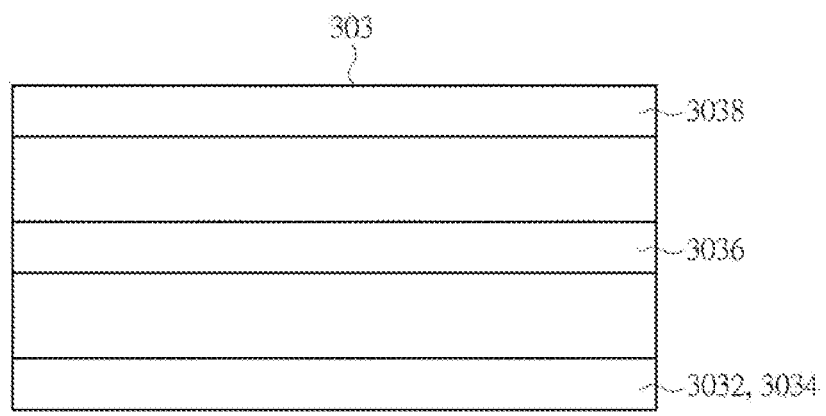
FIG. 4 illustrates a cross-sectional view of a chip in the 3D integrated circuit which shown in FIG. 3.

FIG. 3 illustrates a three-dimensional integrated circuit 300 in accordance with one embodiment of the present invention. As shown in FIG. 3, the 3D integrated circuit 300 includes a plurality of stacked chips, in one embodiment, the 3D integrated circuit 300 includes two 303 and 304, but not limited to. Wherein, in one preferred embodiment, chips 303 and 304 are perpendicular stacked. FIG. 4 illustrates a cross-sectional view of the chip 303 in the 3D integrated circuit 300 which shown in FIG. 3. As shown in FIG. 4, the chip 303 includes a receiver 3032 which comprises a plurality of transistors, a transmitter 3034, a sensing coil 3036, and a magnetic sensor 3038, wherein the magnetic sensor 3038 is configured above the sensing coil 3036, the receiver 3032 and the transmitter 3034, and wherein, the sensing coil 3036 is configured between the receiver 3032, the transmitter 3034 and the magnetic sensor 3038. In one embodiment, the plurality of transistors of the chip 303 can be MOS transistor or BJT, but not limited to. The structure between the sensing coil 3036, the receiver 3032 and the transmitter 3034 and the structure between the sensing coil 3036 and the magnetic sensor 3038 are not shown in FIG. 4. In one embodiment, the magnetic sensor 3038 is composed by the magnetic tunneling junction, but not limited to. In one embodiment, the corresponding locations of the receiver 3042, the transmitter 3044, the sensing coil 3046 and the magnetic sensor 3048 of the chip 304 are as the same as the receiver 3032, the transmitter 3034, the sensing coil 3036 and the magnetic sensor 3038 of the chip 303.

As shown in FIG. 3 and Table 1, when the data is transmitted from chip 303 to the chip 304, the receiver 3032 is disabled, the transmitter 3034 is enabled, the receiver 3042 is enabled and the transmitter 3044 is disabled. Thus, the transmitter 3034 of the chip 303 generates a magnetic field with data based on the sensing coil 3036. Accordingly, the receiver 3042 of the chip 304 receives the data from the sensing coil 3036 of the chip 303 via the magnetic sensor 3048.

Similarly, as shown in FIG. 3 and Table 1, when the data is transmitted from the chip 304 to the chip 303, the receiver 3032 and the transmitter 3044 are enabled, and the transmitter 3034 and the receiver 3042 are disabled. Thus, when the chip 304 transmits the data to the chip 303, the transmitter 3044 of the chip 304 generates a magnetic field with data by the sensing coil 3046. Accordingly, the receiver 3032 of the chip 303 receives the data from the sensing coil 3046 of the chip 304 via the magnetic sensor 3046.

TABLE 1

|  | Data from Chip 303 to Chip 304 | Data from Chip 304 to Chip 303 |
| --- | --- | --- |
| Receiver 3032 | Disabled | Enabled |
| Receiver 3034 | Enabled | Disabled |
| Transmitter 3042 | Enabled | Disabled |
| Transmitter 3044 | Disabled | Enabled |

Figure 5:
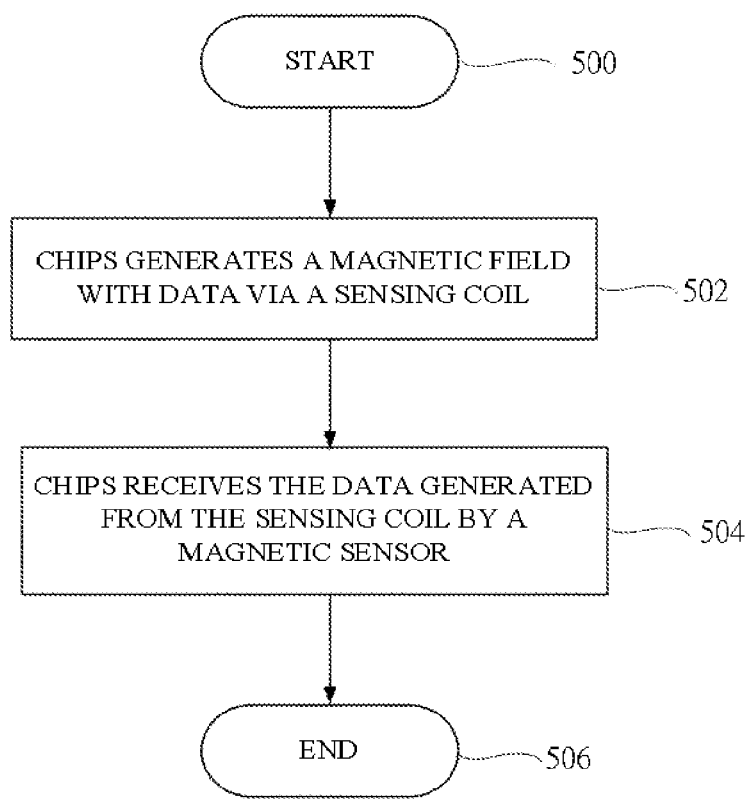
FIG. 5 illustrates a flowchart of data transmission within the three-dimensional integrated circuit in accordance with one embodiment of the present invention.

Please refer to FIG. 3, Table 1 and FIG. 5. FIG. 5 illustrates a flowchart of data transmission within the three-dimensional integrated circuit in accordance with one embodiment of the present invention. FIG. 5 will be explained according to the three-dimensional integrated circuit 300 which shown in FIG. 3. In the step 502, the chip 303 generates a magnetic field with data via the sensing coil 3036. In the step 504, the chip 304 receives the data from the sensing coil 3036 of the chip 303 via the magnetic sensor 3048.

Aforementioned, an embodiment in accordance with the present invention provides a three-dimensional integrated circuit and a method of transmitting data within the three-dimensional integrated circuit thereof. The present invention generates a magnetic field with data via a sensing coil, and then receives the data via a magnetic sensor. Thus, the cost can be reduced, the reliability can be increased and without ESD. Furthermore, the data transmission can be achieved by the magnetic field without any charge, so the data transmission rate is faster than the conventional structure and methodology.

While the foregoing description and drawings represent embodiments of the present invention, it will be understood that various additions, modifications and substitutions may be made therein without departing from the spirit and scope of the principles of the present invention. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, and not limited to the foregoing description.

What is claimed is:

1. A three-dimensional integrated circuit, comprising:
a plurality of perpendicular stacked chips, wherein each said chip comprises at least one transistor, a sensing coil and a magnetic sensor, wherein said magnetic sensor is configured above said sensing coil and said transistor and said sensing coil is located between said transistor and said magnetic sensor,
wherein, said chip generates a magnetic field with data by utilizing said sensing coil, and a first chip of said plurality of perpendicular stacked chips adjacent to said chip receives the data generated by said sensing coil of said chip by said magnetic coil of said first chip.

2. The three-dimensional integrated circuit as claimed in claim 1, wherein said transistor includes a MOS transistor.

3. The three-dimensional integrated circuit as claimed in claim 1, wherein said transistor includes a bipolar junction transistor.

4. The three-dimensional integrated circuit as claimed in claim 1, wherein said magnetic sensor of said chip is composed by a magnetic tunneling junction.

5. A method of transmitting data within a three-dimensional integrated circuit, wherein said three-dimensional integrated circuit comprises a plurality of perpendicular stacked chips, wherein each said chip comprises at least one transistor, a sensing coil and a magnetic sensor, wherein said magnetic sensor is configured above said sensing coil and said transistor and said sensing coil is located between said transistor and said magnetic sensor, said method comprising:
generating a magnetic field with data by said chip; and
receiving said data generated by said sensing coil of said chip by said magnetic coil of a first chip, wherein said first chip adjacent to said chip.

6. The method as claimed in claim 5, wherein said wherein said transistor includes a MOS transistor.

7. The method as claimed in claim 5, wherein said transistor includes a bipolar junction transistor.

8. The method as claimed in claim 5, wherein said magnetic sensor of said chip is composed by a magnetic tunneling junction.

* * * * *